United States Patent
Zeng et al.

(10) Patent No.: US 9,431,300 B1
(45) Date of Patent: Aug. 30, 2016

(54) MOL ARCHITECTURE ENABLING ULTRA-REGULAR CROSS COUPLE

(71) Applicant: GLOBALFOUNDRIES Inc., Grand Cayman (KY)

(72) Inventors: Jia Zeng, Sunnyvale, CA (US); Jongwook Kye, Pleasanton, CA (US); Harry J. Levinson, Saratoga, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/837,222

(22) Filed: Aug. 27, 2015

(51) Int. Cl.
| | |
|---|---|
| H01L 21/82 | (2006.01) |
| H01L 21/8234 | (2006.01) |
| H01L 23/528 | (2006.01) |
| H01L 23/522 | (2006.01) |
| H01L 29/66 | (2006.01) |
| H01L 27/088 | (2006.01) |
| H01L 29/45 | (2006.01) |
| H01L 21/00 | (2006.01) |

(52) U.S. Cl.
CPC ........... *H01L 21/823475* (2013.01); *H01L 21/823437* (2013.01); *H01L 23/5226* (2013.01); *H01L 23/5286* (2013.01); *H01L 27/088* (2013.01); *H01L 29/45* (2013.01); *H01L 29/665* (2013.01)

(58) Field of Classification Search
None
See application file for complete search history.

(56) References Cited

U.S. PATENT DOCUMENTS

| | | | | |
|---|---|---|---|---|
| 6,410,972 B1 * | 6/2002 | Sei | .................... | H01L 27/11807 257/202 |
| 6,661,063 B2 * | 12/2003 | Kikushima | ............. | H01L 27/11 257/288 |
| 9,337,099 B1 * | 5/2016 | Jain | .................. | H01L 21/823418 |
| 2013/0015529 A1 * | 1/2013 | Zhong | ............. | H01L 21/823807 257/369 |
| 2013/0146986 A1 * | 6/2013 | Rashed | ........... | H01L 21/823418 257/369 |
| 2013/0175627 A1 * | 7/2013 | Goldbach | ........... | H01L 27/1104 257/350 |
| 2013/0292772 A1 * | 11/2013 | Ma | ......................... | H01L 23/528 257/368 |
| 2013/0292773 A1 * | 11/2013 | Wang | .................... | H01L 27/088 257/368 |
| 2013/0320451 A1 * | 12/2013 | Liu | ................... | H01L 29/66545 257/368 |
| 2014/0027918 A1 * | 1/2014 | Rashed | .............. | H06G 17/5068 257/773 |
| 2014/0078817 A1 * | 3/2014 | Bentum | ................ | G11C 11/412 365/154 |
| 2015/0287604 A1 * | 10/2015 | Stephens | ........... | H01L 21/76895 438/587 |
| 2015/0356225 A1 * | 12/2015 | Lu | ......................... | H01L 27/092 716/55 |

* cited by examiner

*Primary Examiner* — Evren Seven
(74) *Attorney, Agent, or Firm* — Ditthavong & Steiner, P.C.

(57) ABSTRACT

A method of forming an ultra-regular layout with unidirectional M1 metal line and the resulting device are disclosed. Embodiments include forming first and second vertical gate lines, spaced from and parallel to each other; forming a M1 metal line parallel to and between the first and second gate lines; forming first, second, and third M0 metal segments perpendicular to the M1 metal line; connecting the first M0 metal segment to the M1 metal line and the second gate line; connecting the second M0 metal segment to the first gate line and the second gate line; connecting the third M0 metal segment to the first gate line and the M1 metal line; forming a first gate cut on the first gate line between the second and third M0 metal segments; and forming a second gate cut on the second gate line between the first and second M0 segments.

20 Claims, 6 Drawing Sheets

BACKGROUND

BACKGROUND

BACKGROUND

BACKGROUND

MOL ARCHITECTURE ENABLING ULTRA-REGULAR CROSS COUPLE

TECHNICAL FIELD

The present disclosure relates to semiconductor layouts including a two contact poly pitch (2-CPP) cross-coupling. The present disclosure is particularly applicable to semiconductor layouts for the 10 nanometer (nm) technology node and beyond.

BACKGROUND

A traditional dense library is illustrated in FIG. 1A. The layout includes metal 1 (M1) layer portions 101, 103, and 105, power rails 107 (which are also part of the M1 layer), vias (V0) 109, gate contacts 111, gate lines 113, active areas 115 and 117 for a p-type field effect transistor (PFET) and an n-type field effect transistor (NFET), respectively, and source/drain contacts (CA's) 119. The M1 layer is shown separately in FIG. 1B, portion 121 showing a 2-CPP cross-coupling is shown in FIG. 1C, and the source/drain contact pattern is shown separately in FIG. 1D. As illustrated, M1 requires 3 color patterning, as indicated by segments 101, 103, and 105 and is bidirectional and zigzag. In addition, for the cross-coupling, the CA pattern includes an irregular, diagonal shape, which prevents use of self-aligned double patterning (SADP) for patterning the source/drain contacts.

A need therefore exists for methodology enabling formation of a unidirectional M1 layer with SADP friendly cross-coupling and the resulting device.

SUMMARY

An aspect of the present disclosure is method a forming a cross-couple connection with unidirectional M1 metal lines.

Another aspect of the present disclosure is a cross-coupling with unidirectional M1 metal lines.

Another aspect of the present disclosure is a method of forming an ultra-regular layout with unidirectional M1 metal lines and a cross-coupling connection.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming first and second vertical gate lines, spaced from and parallel to each other; forming a M1 metal line parallel to and between the first and second gate lines; forming first, second, and third metal 0 (M0) metal segments perpendicular to the M1 metal line; connecting the first M0 metal segment to the M1 metal line and the second gate line; connecting the second M0 metal segment to the first gate line and the second gate line; connecting the third M0 metal segment to the first gate line and the M1 metal line; forming a first gate cut on the first gate line between the second and third M0 metal segments; and forming a second gate cut on the second gate line between the first and second M0 segments.

Aspects of the present disclosure include connecting each of the first and third M0 metal segments to the M1 metal line by forming a V0 from the M1 metal line to each of the first and third M0 metal segments; connecting the first M0 metal segment to the second gate line by forming a first gate contact (CB) from the second gate line to the first M0 metal segment; and connecting the third M0 metal segment to the first gate line by forming a second CB from the first gate line to the third M0 metal segment. Further aspects include the first M0 metal segment and the third M0 metal segment being formed touching sides of the first and second CB's respectively. Other aspects include the first M0 metal segment and first CB and the third M0 metal segment and second CB satisfying a zero enclosure rule. Additional aspects include forming additional gate lines equally spaced from and parallel to the first and second gate lines and each other; forming additional M1 metal lines equally spaced and parallel to each other between the additional gate lines; and forming first and second power rails at opposite ends of the M1 metal lines. Another aspect includes forming gridded M1 power tabs connected to the first and second power rails. Further aspects include forming the M1 metal lines and gridded M1 power tabs with a SADP process. Other aspects include forming first and second active areas on a substrate at top and bottom sides, respectively, of a cell, separated from each other; forming the first and second power rails at top and bottom sides, respectively, of the first and second active areas; forming trench silicide segments in the first and second active areas, parallel to and between the gate lines; and forming the M1 metal lines extending from the first active area to the second active area; over the trench silicide segments. An additional aspect includes forming the trench silicide segments by SADP and forming the source/drain contact (CA) by self-aligned via (SAV).

Another aspect of the present disclosure is a device including: first and second vertical gate lines, spaced from and parallel to each other; a M1 metal line parallel to and between the first and second gate lines; first, second, and third M0 metal segments perpendicular to the M1 metal line, wherein the first M0 metal segment is connected to the M1 metal line and the second gate line, the second M0 metal segment is connected to the first gate line and the second gate line, and the third M0 metal segment is connected to the first gate line and the M1 metal line; a first gate cut on the first gate line between the second and third M0 metal segments; and a second gate cut on the second gate line between the first and second M0 metal segments.

Aspects include a V0 from the M1 metal line to each of the first and third M0 metal segments, connecting the first and third M0 metal segments to the M1 metal line; a first CB from the second gate line to the first M0 metal segment, connecting the first M0 metal segment to the second gate line; and a second CB from the first gate line to the third M0 metal segment, connecting the third M0 metal segment to the first gate line. Further aspects include the first M0 metal segment and the third M0 metal segment being formed touching sides of the first and second CB's respectively. An additional aspect includes the first M0 metal segment and first CB and the third M0 metal segment and second CB satisfying a zero enclosure rule. Other aspects include additional gate lines equally spaced from and parallel to the first and second gate lines and each other; additional M1 metal lines equally spaced and parallel to each other between the additional gate lines; and first and second power rails at opposite ends of the M1 metal lines. Another aspect includes gridded M1 power tabs connected to the first and second power rails. Additional aspects include first and second active areas on a substrate at top and bottom sides, respectively, of a cell, separated from each other, wherein the first and second power rails are at top and bottom sides, respectively, of the first and second active areas; and trench silicide segments in the first and second active areas, parallel to and between the gate lines, wherein the M1 metal lines extend from the first active area to the second active area, over the trench silicide segments.

Another aspect of the present disclosure is a method including: forming first and second active areas on a substrate at top and bottom sides of a cell and separated from each other; forming first and second power rails at top and bottom sides of the first and second active areas, respectively; forming first, second, third, fourth, fifth, sixth, seventh, and eighth vertical gate lines, spaced from and parallel to each other, extending between the top and bottom sides of the cell; forming first, second, third, fourth, fifth, sixth, and seventh equally spaced M1 metal lines parallel to and between consecutive adjacent pairs of the first through eighth gate lines, respectively, and extending between the first and second active areas; forming first, second, and third M0 metal segments perpendicular to the M1 metal lines, between the first and second active areas and vertically spaced from each other with the second M0 metal segment between the first and third M0 metal segments; forming a first V0 between the first M0 metal segment and the fourth M1 metal line and a first CB between the fifth gate line and the first M0 metal segment; forming second and third CB's between the second M0 metal segment and the fourth and fifth gate lines, respectively; forming the a fourth CB between the fourth gate line and the third M0 metal segment and a second V0 between the third M0 metal segment and the third M1 metal line; forming a first gate cut on the fourth gate line between the second and third M0 metal segments; forming a second gate cut on the fifth gate line between the first and second M0 metal segments; and forming gridded M1 power tabs connected to the first and second power rails.

Aspects include: forming trench silicide segments by SADP in the first and second active areas, parallel to and between adjacent pairs of the gate lines; forming the M1 metal lines over the trench silicide segments in the first active area to the second active area; and connecting the seventh M1 metal line to underlying trench silicide segments in the first and second active areas by forming a CA on the trench silicide segment and a V0 on the CA between the trench silicide segment and the M1 metal line. Further aspects include: forming additional M0 metal segments between the first and second active areas and perpendicular to the M1 metal lines, and connecting the additional M0 metal segments to M1 metal lines through additional V0's, to gate lines through additional CB's, and to trench silicide segments through additional CA's. Other aspects include forming the first through seventh M1 metal lines and M1 power tabs with a SADP process.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of irregular metal routing and diagonal source/drain contacts, attendant upon forming a traditional 2-CPP cross-coupling. In accordance with embodiments of the present disclosure, horizontal M0 metal segments and vertical M1 metal lines are used with a M0 hand-shake for cross-coupling the gate electrodes, thereby allowing the M1 layer and the trench silicide to be unidirectional and, therefore, SADP friendly. Further, since the M0 layer is unidirectional, the M0 layer is also SADP friendly.

Methodology in accordance with embodiments of the present disclosure includes forming two vertical gate lines, spaced from and parallel to each other, forming a M1 metal line parallel to and between the two gate lines, and forming three M0 metal segments perpendicular to the M1 metal line. The first M0 metal segment is connected to the M1 metal line and the second gate line, the second M0 metal segment is connected to the two gate lines, and the third M0 metal segment to the first gate line and the M1 metal line. Further, a first gate cut on the first gate line between the second and third M0 metal segments, a second gate cut on the second gate line between the first and second M0 segments.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
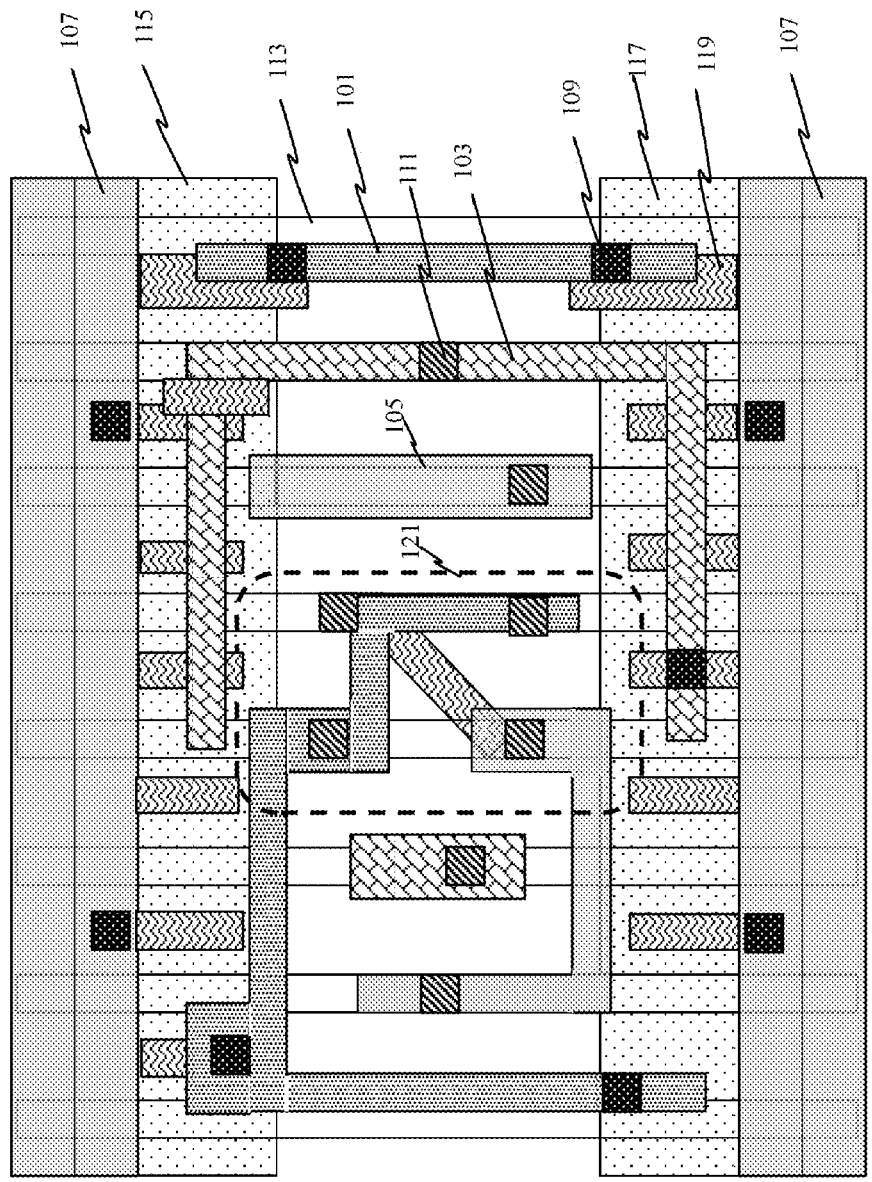
FIG. 1A schematically illustrates a traditional dense library layout, FIG. 1B schematically illustrates the M1 layer from the layout of FIG. 1A, and FIG. 1C schematically illustrates the 2-CPP cross-coupling from the layout of FIG. 1A, and FIG. 1D schematically illustrates the CA pattern from the layout of FIG. 1A.
Figure 1B:
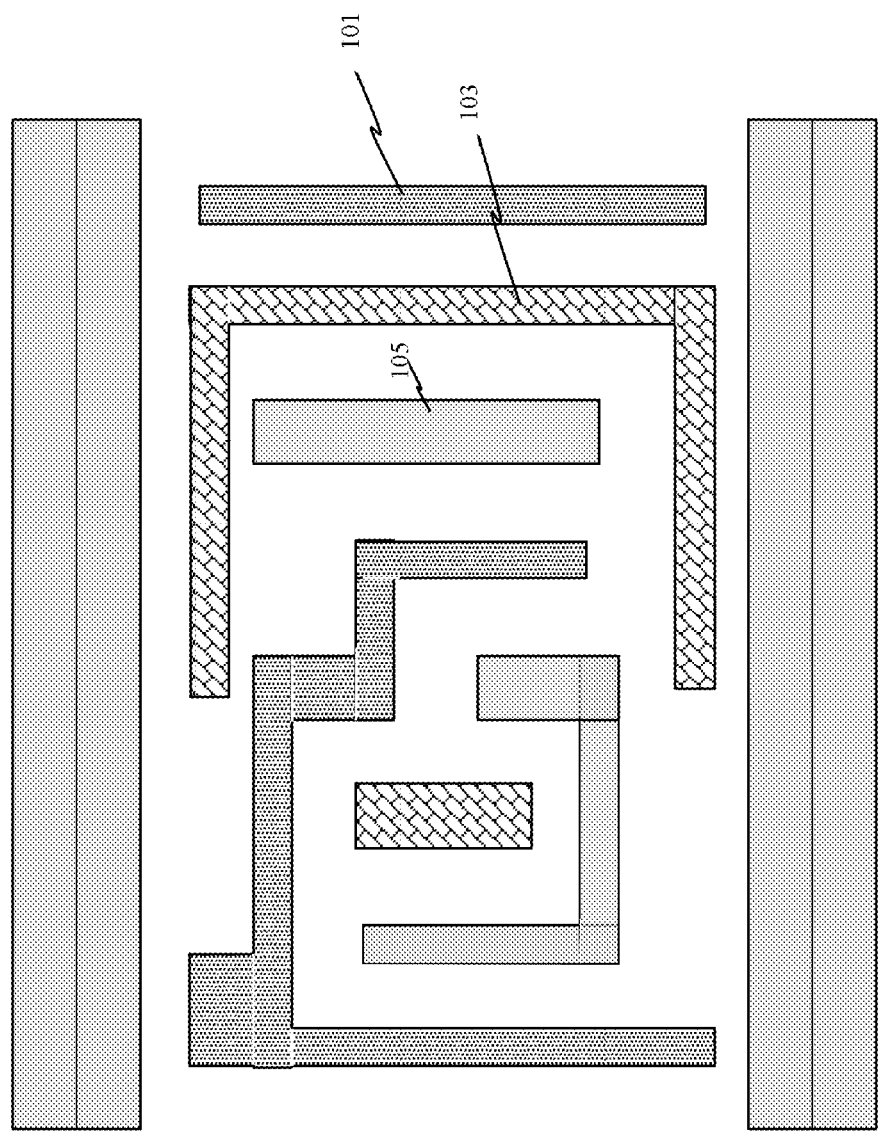
Figure 1C:
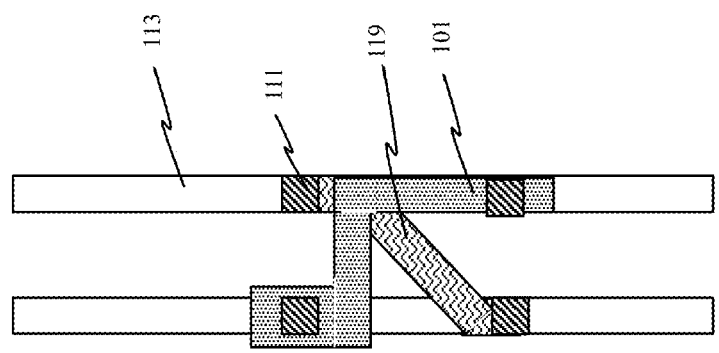
Figure 1D:
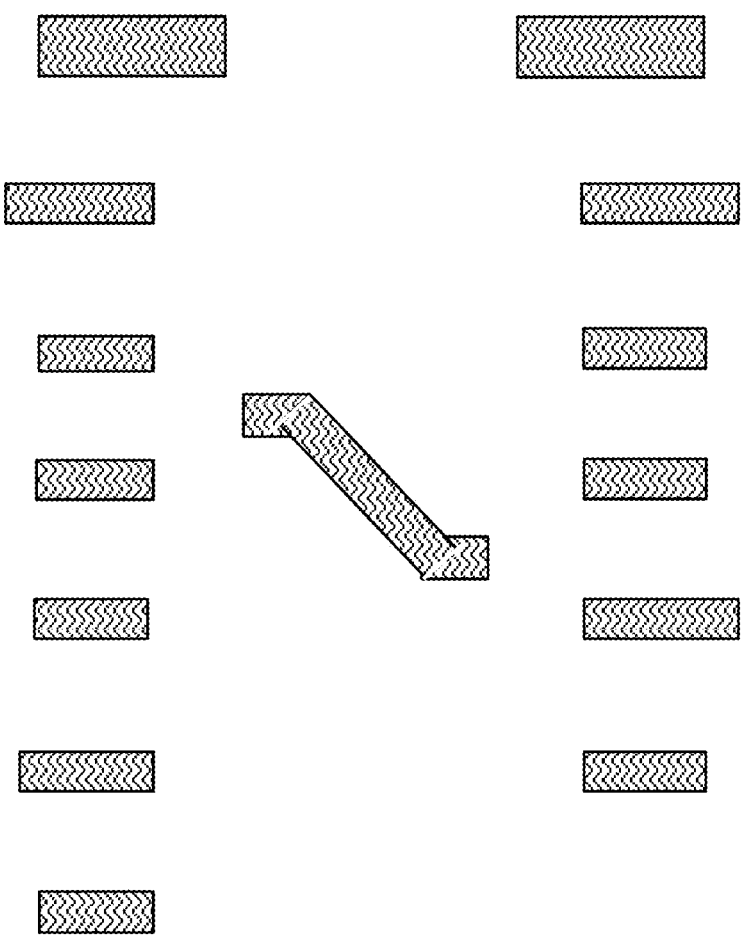
Figure 2A:
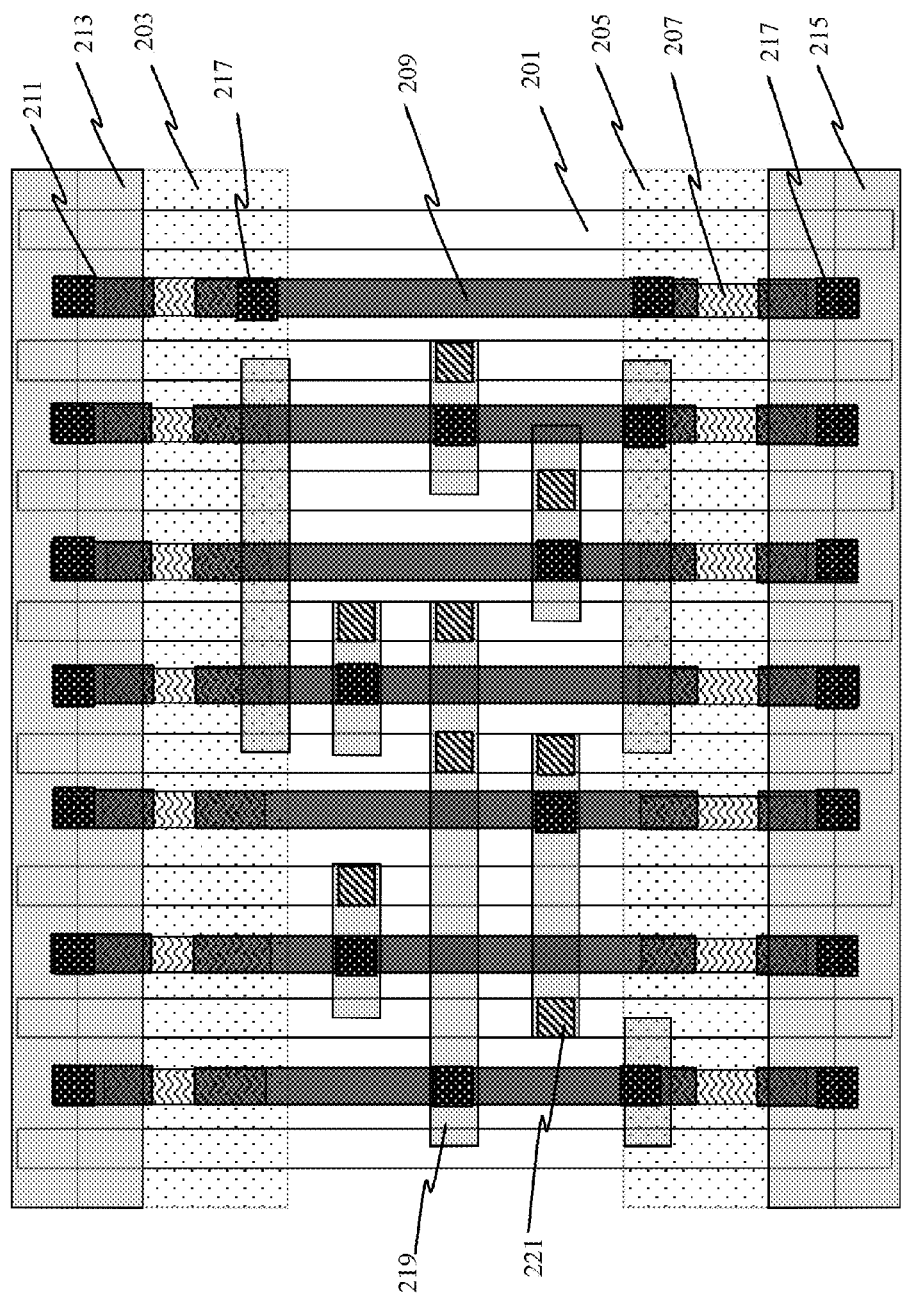
FIG. 2A schematically illustrates a dense library layout with a 2-CPP cross-couple, in accordance with an exemplary embodiment, FIG. 2B schematically illustrates an ideal 2-CPP cross-coupling from the layout of FIG. 2A, and FIG. 2C schematically illustrates a cross-sectional view of the 2-CPP cross-coupling of FIG. 2B.
Figure 2B:
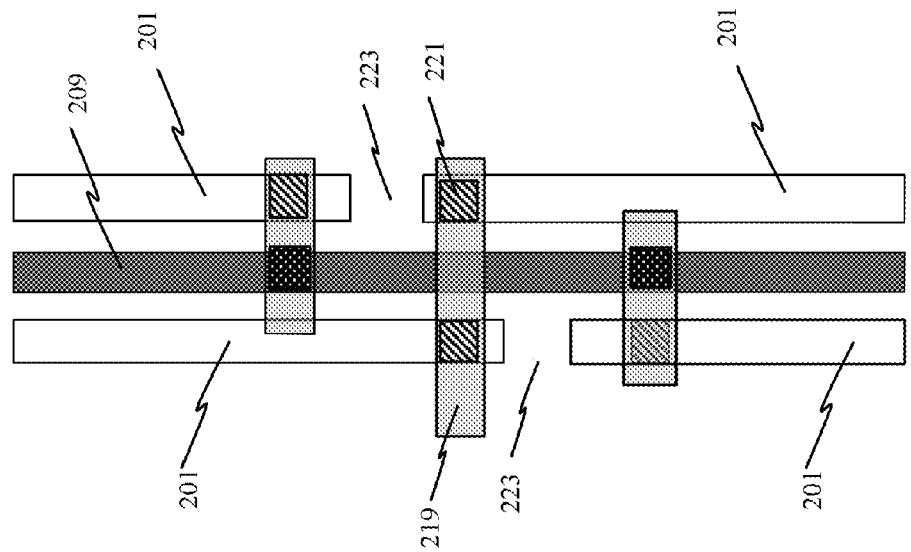
Figure 2C:
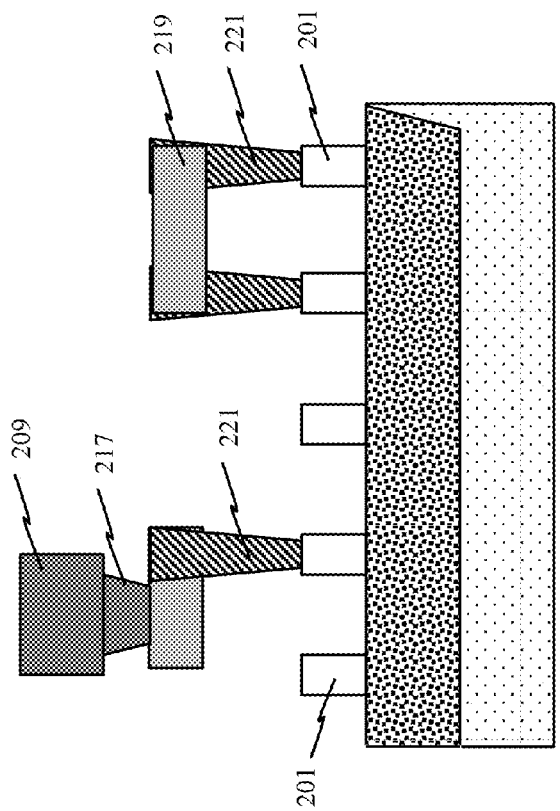

FIG. 2A is a real design, in accordance with an exemplary embodiment, that may require some M2 level connections (not shown for illustrative convenience) in addition to M0 and M1 connections. FIG. 2B is an ideal case of a 2-CPP cross-coupling from the layout of FIG. 2A, in accordance with an exemplary embodiment, that uses only M0 and M1 level connections. FIG. 2C schematically illustrates a cross-sectional view of the 2-CPP cross-coupling of FIG. 2B. Adverting to FIGS. 2A through 2C, gate lines 201 extend vertically and are evenly spaced, and active areas 203 and 205 are formed at opposite ends of the gate liens 201, as in the conventional layout. Trench silicide segments 207 are formed over the active areas 203 and 205 parallel to and between gate lines 201. The trench silicide is unidirectional. M1 metal lines 209 extend vertically in between gate lines 201. M1 metal lines 209 extend from active area 203 to active area 205, with gridded M1 power tabs 211 connected to power rails 213 and 215 through V0's 217. M1 metal lines connect to underlying trench silicide segments 207 through CA's (not shown for illustrative convenience) and V0's 217 over the CA's. As the CA's may now be via shaped, rather than rectangular and diagonal shaped as in the prior art, they may therefore be formed by SAV. As illustrated in FIGS. 2A and 2C, M0 metal segments are formed horizontally in a layer between the active areas and the M1 layer. M0 metal segments 219 connect to gate lines 201 through CB's 221 and to M1 metal lines through V0's 217. M0 metal segments 219 are formed after CB's 221, such that M0 metal segment 219 may be formed to touch the sides of CB 221 rather than as a top-down overlap. As a result of the side-touch, a zero enclosure can be tolerated. For local routing, M0 metal segments 219 also connect to trench silicide segments 207 through CA's (not shown for illustrative convenience).

As illustrated in FIGS. 2B and 2C, a cross-coupling may be formed with a M0 hand-shake, with no diagonal CA's or zigzag metal lines. Specifically, one gate line 201 is connected to a metal line 209 through a CB 221, a M0 metal segment 219, and a V0 217. An adjacent gate line 201 is connected to the metal line 209 through another CB 221, another M0 metal segment 219, and another V0 217. Between the two M0 metal segments 219, a third M0 metal segment 219 and two additional CB's connect the two gate lines 201. Between the third M0 metal segment 219 and each of the other two M0 metal segments, a gate cut 223 is formed on the corresponding gate line 201 (shown in FIG. 2B, but not shown in FIG. 2A for illustrative convenience).

The embodiments of the present disclosure can achieve several technical effects including ultra-regular metal routing for cross-coupling, unidirectional M1 metal lines, and unidirectional trench silicide segments, which in turn allows for use of SADP for both M1 and M0 layers. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices by way of a self-aligned double patterning process, particularly for the 10 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming first and second vertical gate lines, spaced from and parallel to each other;
    forming a metal 1 (M1) metal line parallel to and between the first and second gate lines;
    forming first, second, and third metal 0 (M0) metal segments perpendicular to the M1 metal line;
    connecting the first M0 metal segment to the M1 metal line and the second gate line;
    connecting the second M0 metal segment to the first gate line and the second gate line;
    connecting the third M0 metal segment to the first gate line and the M1 metal line;
    forming a first gate cut on the first gate line between the second and third M0 metal segments; and
    forming a second gate cut on the second gate line between the first and second M0 metal segments.

2. The method according to claim 1, comprising:
    connecting each of the first and third M0 metal segments to the M1 metal line by forming a via (V0) from the M1 metal line to each of the first and third M0 metal segments;
    connecting the first M0 metal segment to the second gate line by forming a first gate contact (CB) from the second gate line to the first M0 metal segment; and
    connecting the third M0 metal segment to the first gate line by forming a second CB from the first gate line to the third M0 metal segment.

3. The method according to claim 2, wherein the first M0 metal segment and the third M0 metal segment are formed touching sides of the first and second CB's respectively.

4. The method according to claim 2, wherein the first M0 metal segment and first CB and the third M0 metal segment and second CB satisfy a zero enclosure rule.

5. The method according to claim 1, further comprising:
    forming additional gate lines equally spaced from and parallel to the first and second gate lines and each other;
    forming additional M1 metal lines equally spaced and parallel to each other between the additional gate lines; and
    forming first and second power rails at opposite ends of the M1 metal lines.

6. The method according to claim 5, further comprising forming gridded M1 power tabs connected to the first and second power rails.

7. The method according to claim 6, comprising forming the M1 metal lines and gridded M1 power tabs with a SADP process.

8. The method according to claim 5, further comprising
    forming first and second active areas on a substrate at top and bottom sides, respectively, of a cell, separated from each other;
    forming the first and second power rails at top and bottom sides, respectively, of the first and second active areas;
    forming trench silicide segments in the first and second active areas, parallel to and between the gate lines; and
    forming the M1 metal lines extending from the first active area to the second active area, over the trench silicide segments.

9. The method according to claim 8, comprising forming the trench silicide segments by self-aligned double patterning (SADP).

10. A device comprising:
    first and second vertical gate lines, spaced from and parallel to each other;

a metal 1 (M1) metal line parallel to and between the first and second gate lines;

first, second, and third metal 0 (M0) metal segments perpendicular to the M1 metal line, wherein
the first M0 metal segment is connected to the M1 metal line and the second gate line,
the second M0 metal segment is connected to the first gate line and the second gate line, and
the third M0 metal segment is connected to the first gate line and the M1 metal line;

a first gate cut on the first gate line between the second and third M0 metal segments; and a second gate cut on the second gate line between the first and second M0 metal segments.

11. The device according to claim 10, wherein
a via (V0) from the M1 metal line to each of the first and third M0 metal segments, connecting the first and third M0 metal segments to the M1 metal line;
a first gate contact (CB) from the second gate line to the first M0 metal segment, connecting the first M0 metal segment to the second gate line; and
a second CB from the first gate line to the third M0 metal segment, connecting the third M0 metal segment to the first gate line.

12. The device according to claim 11, wherein the first M0 metal segment and the third M0 metal segment are formed touching sides of the first and second CB's respectively.

13. The device according to claim 11, wherein the first M0 metal segment and first CB and the third M0 metal segment and second CB satisfy a zero enclosure rule.

14. The device according to claim 10, further comprising:
additional gate lines equally spaced from and parallel to the first and second gate lines and each other;
additional M1 metal lines equally spaced and parallel to each other between the additional gate lines; and
first and second power rails at opposite ends of the M1 metal lines.

15. The device according to claim 14, further comprising gridded M1 power tabs connected to the first and second power rails.

16. The device according to claim 14, further comprising:
first and second active areas on a substrate at top and bottom sides, respectively, of a cell, separated from each other, wherein the first and second power rails are at top and bottom sides, respectively, of the first and second active areas; and
trench silicide segments in the first and second active areas, parallel to and between the gate lines, wherein the M1 metal lines extend from the first active area to the second active area, over the trench silicide segments.

17. A method comprising:
forming first and second active areas on a substrate at top and bottom sides of a cell and separated from each other;

forming first and second power rails at top and bottom sides of the first and second active areas, respectively;

forming first, second, third, fourth, fifth, sixth, seventh, and eighth vertical gate lines, spaced from and parallel to each other, extending between the top and bottom sides of the cell;

forming first, second, third, fourth, fifth, sixth, and seventh equally spaced metal 1 (M1) metal lines parallel to and between consecutive adjacent pairs of the first through eighth gate lines, respectively, and extending between the first and second active areas;

forming first, second, and third metal 0 (M0) metal segments perpendicular to the M1 metal lines, between the first and second active areas and vertically spaced from each other with the second M0 metal segment between the first and third M0 metal segments;

forming a first via (V0) between the first M0 metal segment and the fourth M1 metal line and a first gate contact (CB) between the fifth gate line and the first M0 metal segment;

forming second and third CB's between the second M0 metal segment and the fourth and fifth gate lines, respectively;

forming a fourth CB between the fourth gate line and the third M0 metal segment and a second V0 between the third M0 metal segment and the third M1 metal line;

forming a first gate cut on the fourth gate line between the second and third M0 metal segments;

forming a second gate cut on the fifth gate line between the first and second M0 metal segments; and forming gridded M1 power tabs connected to the first and second power rails.

18. The method according to claim 17, further comprising:
forming trench silicide segments by self-aligned double patterning (SADP) in the first and second active areas, parallel to and between adjacent pairs of the gate lines;
forming the M1 metal lines over the trench silicide segments in the first active area to the second active area; and
connecting the seventh M1 metal line to underlying trench silicide segments in the first and second active areas by forming an active area contact (CA) on the trench silicide segment and a V0 on the CA between the trench silicide segment and the M1 metal line.

19. The method according to claim 17, further comprising forming additional M0 metal segments between the first and second active areas and perpendicular to the M1 metal lines, and connecting the additional M0 metal segments to M1 metal lines through additional V0's, to gate lines through additional CB's, and to trench silicide segments through additional CA's.

20. The method according to claim 17, comprising forming the first through seventh M1 metal lines and M1 power tabs with a SADP process.

* * * * *